United States Patent
Kitamura

[11] Patent Number: 5,989,364
[45] Date of Patent: Nov. 23, 1999

[54] GOLD-ALLOY BONDING WIRE

[75] Inventor: Osamu Kitamura, Kawasaki, Japan

[73] Assignee: Nippon Steel Corporation, Tokyo, Japan

[21] Appl. No.: 09/051,463

[22] PCT Filed: Apr. 21, 1994

[86] PCT No.: PCT/JP94/00660

§ 371 Date: Dec. 12, 1994

§ 102(e) Date: Dec. 12, 1994

[87] PCT Pub. No.: WO94/24323

PCT Pub. Date: Oct. 27, 1994

[30] Foreign Application Priority Data

Apr. 22, 1993 [JP] Japan ...... 5-096212

[51] Int. Cl.$^6$ .......... H01B 1/02; C22C 5/02
[52] U.S. Cl. .......... 148/430; 420/507; 420/511
[58] Field of Search .......... 148/430; 420/507, 420/511

[56] References Cited

FOREIGN PATENT DOCUMENTS

| | | |
|---|---|---|
| 58096741 | 6/1983 | Japan . |
| 63145729 | 6/1988 | Japan . |
| 02260643 | 10/1990 | Japan . |
| 5175271 | 7/1993 | Japan . |

*Primary Examiner*—Sikyin Ip
*Attorney, Agent, or Firm*—Kenyon & Kenyon

[57] ABSTRACT

A thin wire of gold alloy for wire bonding, consisting of: a first group consisting of 2 to 10 ppm by weight of scandium, 3 to 20 ppm by weight of beryllium, and 2 to 50 ppm by weight of indium; and the balance consisting of gold and unavoidable impurities. The thin wire has a loop height of 200 μm or more and a wire flow after resin molding of not more than 5%.

3 Claims, No Drawings

GOLD-ALLOY BONDING WIRE

TECHNICAL FIELD

The present invention relates to a thin wire of gold alloy for wire bonding suitable for use in connecting the electrodes on a semiconductor element to the external leads, more specifically to a thin wire of gold alloy for wire bonding providing an improved bonding strength and preventing a reduction in the loop height.

BACKGROUND ART

The bonding wire for connecting the electrodes on a semiconductor element to the external leads is conventionally a thin wire of gold alloy because of its good electrocoductivity, corrosion resistance, or other reliable properties.

Bonding of the thin gold alloy wire is typically performed by a thermocompression bonding process, in which the top end of a thin gold alloy wire is melted by heating with an electric torch to form a ball due to the surface tension of the melted metal, the ball is then pressed against an electrode on a semiconductor element heated at 150 to 300° C. with an ultrasonic vibration applied thereto to form a bond, and thereafter, bonding to the external lead is performed by an ultrasonic compression bonding process in the same manner.

Advanced integration of semiconductor elements involves an increased number of electrodes on a semiconductor element. Miniaturization of semiconductor elements involves a reduced area of an electrode and a shortened pitch or distance between electrodes, and therefore, requires that bonding wires should provide a reduced ball size and should have a reduced diameter. The reduction in the ball size reduces the heat input from an electric torch to the bonding wire upon forming the ball, thereby reducing the length of the region of the wire in which recrystallization occurs during the formation of the ball. It is known that there is a close relationship between the recrystallization region length and the loop height of the wire, such that a bonding wire having a long recrystallization region has a high loop, and vice versa. Namely, under a reduced ball size, the conventional loop height cannot be obtained unless the recrystallization region length is increased by decreasing the contents of the alloying elements in a bonding wire gold alloy that control the recrystallization. The alloying elements that control the recrystallization generally also improve the mechanical strength of wire, so that reduction in the contents of such alloying elements causes reduction in the mechanical strength of wire.

The loop height is also reduced by thinning of a bonding wire. Specifically, the ball size is usually controlled to a fixed value within the range of from 2.5 to 3.0 times the wire diameter, so that reduction of the wire diameter brings about the same effect as that obtained by reducing the ball size, and therefore, thinning of a bonding wire causes reduction in the loop height.

The reduction in the ball size, or the thinning of the bonding wire, thus leads to reduction in the loop height, and thereby, causes the problems in reliability and production yield of semiconductor devices because the bonding wires are undesirably brought into contact with the semiconductor element or the die pads of leadframes, causing device malfunction or defects, because the pull strength is reduced by the reduced loop height, and because bonding wires are brought into contact with each other by a wire flow induced by wire deformation because of a flow resistance to a resin used for sealing the semiconductor elements.

To prevent occurrence of these problems, a usual measure is to reduce the contents of the elements that control the recrystallization region length. However, this causes a reduction in the mechanical strength and coarsening of the recrystallized grains of a wire in the portion immediately above the ball being formed, so that the portion immediately above the ball is easily broken by vibration during handling after bonding, to cause poor reliability and a reduced production yield of semiconductor devices.

To solve this problem, many kinds of thin gold alloy wires have been proposed; for example, a gold bonding wire comprising from 5 to 100 ppm by weight of calcium (Japanese Unexamined Patent Publication (Kokai) No. 53-105968), a gold bonding wire comprising from 3 to 5 ppm by weight of calcium, from 1 to 8 ppm by weight of beryllium, and/or from 5 to 50 ppm by weight of germanium (Japanese Unexamined Patent Publication (Kokai) No. 53-112060), and a gold bonding wire comprising from 1 to 8 ppm by weight of beryllium (Japanese Unexamined Patent Publication (Kokai) No. 53-112059).

However, these gold bonding wires have the problem that the loop height after bonding is reduced because of an increased content of the alloying elements for preventing coarsening of the crystal grains immediately above the ball. Moreover, the alloy composition containing beryllium alone as an additive alloying element to the gold base provides a high loop but has the problems that the mechanical strength of wire is lower and the wire flow after resin molding is more significant in comparison with the other alloy compositions.

Control of the loop height is currently effected by the loop shape control system of a bonder to ensure the necessary loop height, but this requires a long duration of time for bonding and causes problems somewhat in the productivity. The conventional bonding wire is not successful in providing large loop height while preventing the coarsening of crystal grains at the wire portion immediately above the ball. There has been a strong need for a thin wire of gold alloy for wire bonding that reliably provides a large loop height and high bonding strength.

The present inventors studied many of the conventionally proposed thin wires of gold alloy for wire bonding and discovered the following fact. The conventional thin wires of gold alloy for wire bonding have a pull strength greater than that of a pure gold wire containing no additive elements, but when a high loop must be formed, the contents of the alloying elements must be reduced, with the result that the pull strength becomes poor and the recrystallized crystal grains easily coarsen in the wire portion immediately above the ball thereby causing damage in the ball neck during the bonding operation. Reduction in the wire diameter involves reduction in the pull strength in accordance with the reduced wire sectional area. Therefore, to ensure a good pull strength, the contents of the alloying elements must be increased, with the result that the large loop height cannot be provided.

DISCLOSURE OF THE INVENTION

The object of the present invention is to provide a thin wire of gold alloy for wire bonding in which the ball size is reduced for the same wire diameter, a large loop height is provided in spite of the reduced wire diameter, a high bonding strength is maintained, and the wire flow is mitigated.

To solve the above-mentioned problems, the present inventors carried out various studies on alloying elements capable of improving the pull strength without causing excessive enhancement in the heat resistance or recrystallization temperature, while ensuring a large loop height.

As a result, the present inventors have found a bonding wire consisting of a gold alloy having the alloying elements of scandium, beryllium, and indium. They also found that, in addition to scandium, beryllium, and indium, small amounts of calcium, yttrium, and rare earth metals, or a small amount of germanium are advantageously used as alloying elements to enhance the above-mentioned effect of the present invention and that silver, copper and palladium can be additionally used as alloying elements to advantageously improve the bondability of the thin wire of gold alloy to the electrodes on a semiconductor element in comparison with that obtained with the conventional bonding wire.

Specifically, the present invention provides the following (1) to (3).

(1) A thin wire of gold alloy for wire bonding, consisting of:

a first group consisting of 2 to 10 ppm by weight of scandium, 3 to 20 ppm by weight of beryllium, and 2 to 50 ppm by weight of indium; and the balance consisting of gold and unavoidable impurities.

(2) A thin wire of gold alloy for wire bonding, consisting of:

the first group as defined in 1;

at least one component selected from a second group consisting of 1 to 5 ppm by weight of calcium, 1 to 5 ppm by weight of yttrium, 1 to 5 ppm by weight of at least one of rare earth metals, and 10 to 50 ppm by weight of germanium; and the balance consisting of gold and unavoidable impurities.

(3) A thin wire of gold alloy for wire bonding, consisting of:

at least one group of the first group as defined in claim 1 and the second group as defined in 2;

5 to 50 ppm by weight of silver;

5 to 30 ppm by weight of palladium;

5 to 40 ppm by weight of copper; and the balance consisting of gold and unavoidable impurities.

The constitution of the present invention will be described in more details below.

The gold suitably used in the present invention has a purity of 99.995 percent by weight or more of gold, the balance being unavoidable impurities. When the purity is less than 99.995 percent by weight, the impurities exhibit a significant effect and obscure the intended effect of the alloying elements, particularly when the total amount of alloying elements is small.

Scandium has a relatively large solubility limit in gold and effectively raises the recrystallization temperature, but these effects are weaker than calcium and not significant when scandium alone is used as an alloying element. Through various studies, it was found that the ball neck strength is improved by co-addition of beryllium and indium together with scandium to a high purity gold, to provide an improved pull strength and a high loop. This is because the co-presence of the three elements of scandium, beryllium and indium reduces the fluctuation of the recrystallized grain size due to thermal influence during forming the ball in comparison with the fluctuation encountered in the conventional thin wire of gold alloy. This phenomenon is believed to be based on the fact that an interaction among the three elements in the high purity gold provides a uniform solid solution to suppress the growth of recrystallized crystal grains because of heat input during bonding.

It has been also found that the addition of scandium to gold also improves the Young's modulus to suppress the wire flow during resin molding. It is also found that the Young's modulus is further improved by co-addition of indium and beryllium together with scandium. The effect, however, is fluctuated by the proportions of these three elements. This is believed to be because the material texture is varied by different intensities of the interactions among these three elements, although the detail has not been clarified. Some improvement of the Young's modulus is also brought about by the presence of the later-described rare earth metals. This effect is also enhanced by the co-presence of the afore-mentioned three elements to mitigate the wire flow significantly.

When the scandium content is less than 2 ppm by weight, the recrystallized grains, generated by the heat input during forming the ball, include different grain sizes, i.e., fine and coarse grains causing a significant fluctuation of the pull strength. On the other hand, if the scandium content is more that 10 ppm by weight, the loop height becomes small even with the co-presence of the later-described beryllium and indium, and moreover, a firm oxide is formed on the ball surface to facilitate formation of shrinkage holes at the ball tip, so that the shear strength is reduced and the long term reliability is also reduced. To ensure a high loop with the alloy composition according to the present invention, the scandium content is preferably not more than 10 ppm by weight, and must be within the range of from 2 to 10 ppm by weight.

Beryllium is known to improve the room temperature strength of a thin gold wire due to work hardening upon wire drawing. This effect is insufficient and fluctuates with a beryllium content of less than 3 ppm by weight under the co-presence of scandium. When the beryllium content is more than 20 ppm by weight, a firm oxide is formed on the ball surface because of oxidation during forming the ball, thereby reducing the bonding area between the ball and an electrode on a semiconductor element and lowering the bonding strength (shear strength). It should be also note that the ball hardness is raised as the beryllium content is increased to increase the load for ensuring good bonding between the ball and an electrode, causing cracking of the semiconductor device in the portion below the electrode. Thus, the beryllium content must be 3 to 20 ppm by weight.

Indium is known to effectively enlarge the recrystallization region upon forming the ball and thereby increases the loop height. This effect is insufficient and fluctuates with an indium content of less than 2 ppm by weight under the co-presence of scandium. When the indium content is more than 50 ppm by weight, an accelerated coarsening of the recrystallized grains occurs in the wire portion immediately above the ball, causing cracks in the wire portion immediately above the ball upon control of the loop shape during bonding. Therefore, the indium content must be 2 to 50 ppm by weight.

Calcium and other additive elements of the second group are used in order to prevent reduction of the mechanical strength of a thin wire of gold alloy during thinning (by wire drawing), to prevent coarsening of the recrystallized grains in the ball neck, and to improve the mechanical strength of the thin wire of gold alloy for the same wire diameter. However, the second group elements, when used in large amounts, raise the heat resistance of the thin gold alloy wire to shorten the length of the wire region in which recrystallization occurs during forming the ball. Therefore, there are upper limits of the contents of the second group elements to ensure a high loop. Calcium, yttrium and rare earth metals are known to improve the heat resistance even when present in relatively small amounts. When the contents of these elements are less than 1 ppm by weight, the wire has the problem in quality that the mechanical strength fluctuates significantly from site to site. On the other hand, when the contents are more than 5 ppm by weight, the improved heat resistance narrows the recrystallization region and fails to provide a high loop. Therefore, the contents of the second group elements must be 1 to 5 ppm by weight, in order to ensure both high loop and good mechanical strength.

The addition of calcium, yttrium and rare earth metals also provide the effect that the thin wire of gold alloy containing these elements in small amounts has a Young's modulus of about 1000 to 2000 kg/mm$^2$ greater than that of pure gold. The thus-improved Young's modulus suppresses the wire flow after resin molding, in contrast to the conventional thin wire for providing high loop that exhibits a large wire flow after sealing because the Young's modulus cannot be improved due to the relatively limited amounts of alloying elements.

Germanium is known to improve the room temperature strength and is used to prevent reduction in the strength due to thinning of the wire. The germanium content must be within the range of from 10 to 50 ppm by weight, because an amount less than 10 ppm by weight provides no significant improvement in the strength and an amount more than 50 ppm by weight reduces the heat resistance. Germanium may be advantageously used together with calcium, yttrium and rare earth metals.

Silver effectively improves the mechanical properties when present in a large amount, but this effect is not significant with a small amount. Through many studies, the present inventors found that a thin wire of a gold alloy containing silver and copper in certain amounts has a bonding strength (shear strength) greater than that exhibited by a gold containing these elements in amounts as small as several ppm by weight. Further studies proved that this effect is stably obtained when palladium, together with silver and copper, are added to gold together. These elements form a complete solid solution with gold. Therefore, the above-mentioned phenomenon is believed to be caused by the fact that these elements are dispersed uniformly in gold to mitigate precipitation on the grain boundaries. Various experiments showed that the silver content must be 5 to 50 ppm by weight, the copper content must be 5 to 40 ppm by weight, and the palladium content must be 4 to 30 ppm by weight, in order to provide a significant improvement in the shear strength.

BEST MODE FOR CARRYING OUT THE INVENTION

EXAMPLE

An electrolytic gold having a gold purity of 99.995 wt % or more and high purity (purity of 99.9 wt % or more) metals as additives, in selected amounts, were melted in a vacuum induction melting furnace and cast to prepare mother metals for the respective additive elements.

Selected amounts of the thus-prepared mother metals and the electrolytic gold of a gold purity of 99.995 wt % or more were melted in a vacuum induction melting furnace and cast to produce ingots of the gold alloys having the chemical compositions shown in Table 1. The cast ingots were caliber- or groove-rolled and drawn at room temperature to form thin gold alloy wires having a final diameter of 25 $\mu$m. The thin gold alloy wires were continuously annealed in air so that the product wire had an elongation of about 4%.

The thus-obtained thin gold alloy wires were subjected to mechanical testing at room temperature and used in a high speed automatic bonder to wire-bond a 42-nickel GFP leadframe having 100 pins, a step of 200 $\mu$m between the electrodes and the inner lead surface, and an average bonding span of 2.6 mm. After the bonding, the loop height, the bonding strength, the wire flow after resin molding, and the ball shape were studied and the results are also summarized in Table 1.

The loop height was determined by an optical-microscopic measurement of the distance between an electrode on a semiconductor element and the loop top formed when the electrode is connected to an external lead with a thin gold alloy wire, repeating this measurement for 100 wires, and averaging the 100 results.

The bonding strength was evaluated from data of the pull strength and the fluctuation thereof for 100 wires determined by fixing the leadframe high speed automatic-bonded and the semiconductor element with a jig, pulling a thin gold alloy wire in the middle, and measuring the strength upon breakage of the wire. The bonding strength was also evaluated from data of the shear strength and the fluctuation thereof for 100 wires determined by travelling the jig, disposed 3$\mu$m distant from the electrodes, in a direction parallel with the semiconductor element, until the gold ball bonded to an electrode was broken by shear, and measuring the maximum load upon the breakage.

The wire flow after resin molding was evaluated by mounting a wire-bonded leadframe on a metal die heated at 175° C., sealing this assembly by using a commercially available sealing resin from one and the same lot, measuring the maximum flexure of the wire by using a soft X-ray transmitter, repeating this measurement for 100 wires, calculating the ratio of the flexure to the bonding span for each wire, and averaging the data for 100 wires.

The ball shape was evaluated by scanning electron microscopic observation of gold balls obtained by arc electric discharge generated by an electric torch of a high speed automatic bonder. Those balls that are likely to fail in providing good bonding to the electrodes on a semiconductor element because of their abnormal shapes or oxides formed thereon are marked "Defective" and those balls providing good bonding are marked "Good".

Table 1 shows an evaluation of the thin gold alloy wires having the chemical compositions according to the present invention whereas Table 2 shows an evaluation of the thin gold alloy wires having the chemical compositions outside the range of the present invention. Tables 1 and 2 show the known phenomenon that the reduction in the loop height corresponds to the reduction in the pull strength.

It is generally recognized that a pull strength of 5 gf or more is sufficient to ensure the reliability of semiconductor devices. Comparison of the pull strength between wires having substantially the same loop height shows that the wires of Table 1 have pull strengths which are greater than 5 gf, greater than those of the wires of Table 2, and small in fluctuation.

It is generally recognized that a 25 $\mu$m thin gold alloy wire having a shear strength of 50 g or more causes no problem. All the wires in Table 1 have a shear strength of 50 g or more, whereas some wires in Table 2 have a shear strength of less than 50 g and are not suitable for use in wire bonding. When the alloying elements are present in excessive amounts outside the claimed range as shown in Table 2, the shear strength is lowered and significantly fluctuated.

It is generally recognized that a wire flow after resin molding of not more than 5% causes no problem. All the data shown in Table 1 fall in this range.

The chemical compositions shown in Table 1 according to the present invention provide always normal ball shape, whereas the chemical compositions shown in Table 2 causes abnormal ball shapes including a shrinkage in the ball tip, an excessive oxide on the ball surface, a non-globular ball, etc.

Many of the samples according to the present invention have room temperature breakage strengths of more than 11 gf with an elongation of 4%. This shows that further thinning from 25 to 23 μm would provide good strength. It should be also noted that the samples according to the present invention mostly have loop heights of more than 200 μm, and thus advantageously ensure high loop, high strength, and small wire flow.

TABLE 1

| | Examples | | | | | | | | | | | | | | | | | | | | | |
|---|---|---|---|---|---|---|---|---|---|---|---|---|---|---|---|---|---|---|---|---|---|---|
| | Content (ppm by weight) | | | | | | | | | | | | Mechanical Strength | | Loop Height | | Pull Strength | | Shear Strength | | Wire Flow | |
| | | | | | | | | | | | | | B.1 | E.1 | (μm) | | (gf) | | (gf) | | (%) | Ball |
| No. | Sc | Be | Ca | Y | La | Ce | Dy | Ge | In | Ag | Cu | Pd | (gf) | (%) | Ave. | σ | Ave. | σ | Ave. | σ | Ave. | Shape |
| 1 | 2 | 3 | — | — | — | — | — | — | 2 | — | — | — | 7.9 | 4.3 | 242.4 | 7.6 | 6.4 | 0.68 | 73.6 | 5.3 | 5.0 | Good |
| 2 | 2 | 19 | — | — | — | — | — | — | 2 | — | — | — | 8.7 | 4.2 | 240.5 | 6.8 | 7.2 | 0.64 | 70.1 | 6.0 | 4.9 | Good |
| 3 | 2 | 3 | — | — | — | — | — | — | 49 | — | — | — | 7.5 | 4.7 | 248.1 | 6.9 | 6.7 | 0.71 | 72.6 | 5.7 | 5.1 | Good |
| 4 | 2 | 19 | — | — | — | — | — | — | 49 | — | — | — | 8.5 | 4.4 | 238.9 | 7.0 | 7.1 | 0.72 | 69.4 | 5.8 | 5.0 | Good |
| 5 | 9 | 3 | — | — | — | — | — | — | 2 | — | — | — | 9.8 | 4.5 | 225.6 | 6.3 | 7.5 | 0.68 | 70.2 | 5.5 | 3.2 | Good |
| 6 | 9 | 3 | — | — | — | — | — | — | 48 | — | — | — | 9.6 | 4.6 | 235.3 | 6.7 | 7.7 | 0.65 | 68.5 | 5.3 | 3.4 | Good |
| 7 | 9 | 20 | — | — | — | — | — | — | 2 | — | — | — | 10.6 | 4.2 | 233.7 | 6.1 | 8.0 | 0.59 | 68.5 | 5.2 | 3.6 | Good |
| 8 | 9 | 20 | — | — | — | — | — | — | 49 | — | — | — | 10.5 | 4.3 | 230.6 | 6.3 | 7.9 | 0.61 | 67.8 | 5.5 | 3.7 | Good |
| 9 | 4 | 8 | — | — | — | — | — | — | 10 | — | — | — | 9.3 | 4.2 | 237.1 | 6.2 | 7.3 | 0.58 | 71.4 | 5.7 | 4.4 | Good |
| 10 | 5 | 10 | — | — | — | — | — | — | 20 | — | — | — | 9.8 | 4.2 | 239.5 | 5.9 | 7.4 | 0.54 | 70.5 | 5.2 | 4.3 | Good |
| 11 | 4 | 8 | 1 | — | — | — | — | — | 10 | — | — | — | 9.9 | 4.5 | 225.7 | 5.4 | 7.6 | 0.62 | 71.4 | 5.3 | 4.2 | Good |
| 12 | 4 | 8 | — | 1 | — | — | — | — | 10 | — | — | — | 9.8 | 4.6 | 223.9 | 5.6 | 7.5 | 0.65 | 68.6 | 5.6 | 4.3 | Good |
| 13 | 4 | 8 | — | — | 1 | — | — | — | 10 | — | — | — | 9.6 | 4.5 | 228.4 | 5.3 | 7.5 | 0.58 | 67.2 | 4.9 | 4.1 | Good |
| 14 | 4 | 8 | — | — | — | 1 | — | — | 10 | — | — | — | 9.4 | 4.8 | 230.6 | 5.5 | 7.7 | 0.62 | 68.9 | 5.6 | 4.2 | Good |
| 15 | 4 | 8 | — | — | — | — | 1 | — | 10 | — | — | — | 9.6 | 4.3 | 229.5 | 5.1 | 7.3 | 0.59 | 67.3 | 5.2 | 4.1 | Good |
| 16 | 4 | 8 | — | — | — | — | — | 10 | 10 | — | — | — | 8.9 | 4.1 | 235.7 | 5.9 | 6.8 | 0.63 | 74.2 | 6.1 | 4.3 | Good |
| 17 | 5 | 10 | 1 | — | — | — | — | — | 25 | 10 | — | — | 10.1 | 4.3 | 220.8 | 4.8 | 7.8 | 0.55 | 70.5 | 5.4 | 4.1 | Good |
| 18 | 5 | 10 | 5 | — | — | — | — | — | 30 | — | — | — | 11.2 | 4.4 | 195.7 | 4.6 | 8.0 | 0.59 | 63.5 | 5.0 | 3.5 | Good |
| 19 | 5 | 10 | — | 5 | — | — | — | — | 30 | — | — | — | 11.5 | 4.1 | 193.7 | 5.0 | 7.9 | 0.53 | 62.9 | 4.9 | 3.1 | Good |
| 20 | 5 | 10 | — | — | 5 | — | — | — | 30 | — | — | — | 10.9 | 4.6 | 196.1 | 5.3 | 7.9 | 0.51 | 64.2 | 5.5 | 3.3 | Good |
| 21 | 5 | 10 | — | — | — | 5 | — | — | 30 | — | — | — | 10.5 | 4.8 | 199.5 | 6.3 | 7.3 | 0.49 | 62.8 | 5.7 | 3.1 | Good |
| 22 | 5 | 10 | — | — | — | — | 5 | — | 30 | — | — | — | 10.6 | 4.7 | 189.8 | 5.5 | 7.2 | 0.55 | 60.4 | 5.1 | 3.2 | Good |
| 23 | 5 | 10 | — | — | — | — | — | 50 | 30 | — | — | — | 10.5 | 4.4 | 235.5 | 6.0 | 7.8 | 0.52 | 71.8 | 5.6 | 3.1 | Good |
| 24 | 5 | 10 | 2 | 2 | — | — | — | — | 30 | — | — | — | 10.7 | 4.3 | 200.1 | 5.7 | 7.9 | 0.57 | 65.3 | 5.2 | 3.3 | Good |
| 25 | 5 | 10 | 2 | — | 2 | — | — | — | 30 | — | — | — | 10.5 | 4.7 | 205.3 | 5.3 | 8.1 | 0.61 | 63.6 | 5.5 | 3.2 | Good |
| 26 | 5 | 10 | 2 | — | — | 2 | — | — | 30 | — | — | — | 10.6 | 4.5 | 203.4 | 5.7 | 7.7 | 0.57 | 64.1 | 5.7 | 3.1 | Good |
| 27 | 5 | 10 | 2 | — | — | — | 2 | — | 30 | — | — | — | 10.2 | 4.7 | 208.1 | 6.1 | 7.4 | 0.62 | 61.6 | 6.3 | 3.4 | Good |
| 28 | 5 | 10 | 2 | — | — | — | 2 | 25 | 30 | — | — | — | 10.8 | 4.6 | 203.7 | 5.4 | 7.2 | 0.57 | 62.0 | 5.4 | 3.3 | Good |
| 29 | 5 | 10 | 2 | — | — | — | — | 30 | 30 | — | — | — | 11.0 | 4.3 | 211.6 | 5.8 | 8.3 | 0.63 | 65.8 | 5.7 | 3.2 | Good |
| 30 | 5 | 10 | 2 | — | 2 | — | — | 30 | 30 | — | — | — | 11.5 | 4.5 | 198.8 | 5.6 | 7.8 | 0.64 | 66.3 | 6.2 | 3.1 | Good |
| 31 | 5 | 10 | — | 2 | 2 | — | — | — | 30 | — | — | — | 10.9 | 4.6 | 201.7 | 5.3 | 7.9 | 0.57 | 63.8 | 5.8 | 3.4 | Good |
| 32 | 5 | 10 | — | 2 | — | 2 | — | — | 30 | — | — | — | 11.1 | 4.4 | 196.4 | 4.9 | 8.1 | 0.54 | 64.1 | 6.0 | 3.3 | Good |
| 33 | 5 | 10 | — | 2 | — | — | 2 | — | 30 | — | — | — | 10.8 | 4.6 | 200.9 | 5.1 | 8.2 | 0.61 | 63.5 | 5.4 | 3.6 | Good |
| 34 | 5 | 10 | — | 2 | — | — | 2 | 20 | 30 | — | — | — | 11.3 | 4.7 | 196.1 | 4.9 | 8.0 | 0.58 | 62.9 | 5.8 | 3.5 | Good |
| 35 | 3 | 15 | — | — | 3 | 1 | — | — | 20 | — | — | — | 10.7 | 4.3 | 196.9 | 5.6 | 7.9 | 0.64 | 65.2 | 5.1 | 3.3 | Good |
| 36 | 3 | 15 | — | — | 3 | — | 1 | — | 20 | — | — | — | 10.5 | 4.7 | 205.1 | 4.9 | 8.0 | 0.59 | 61.6 | 5.5 | 3.5 | Good |
| 37 | 3 | 15 | — | — | 3 | — | 1 | 40 | 20 | — | — | — | 11.6 | 4.7 | 202.8 | 6.1 | 8.5 | 0.48 | 60.3 | 4.8 | 3.4 | Good |
| 38 | 3 | 15 | — | — | — | 3 | 2 | — | 20 | — | — | — | 10.4 | 4.7 | 199.5 | 5.7 | 7.7 | 0.50 | 64.1 | 5.1 | 3.3 | Good |
| 39 | 3 | 15 | — | — | — | 3 | 2 | 25 | 20 | — | — | — | 11.3 | 4.8 | 193.7 | 5.3 | 7.0 | 0.53 | 63.9 | 5.7 | 3.1 | Good |
| 40 | 4 | 10 | — | — | — | — | — | — | 15 | 5 | 5 | 5 | 10.2 | 4.3 | 240.1 | 4.2 | 8.1 | 0.44 | 75.5 | 5.0 | 3.7 | Good |
| 41 | 4 | 10 | — | — | — | — | — | — | 15 | 50 | 40 | 30 | 10.6 | 4.5 | 236.9 | 4.0 | 8.3 | 0.41 | 74.9 | 4.7 | 3.4 | Good |
| 42 | 4 | 10 | 1 | 1 | 1 | 1 | — | 25 | 25 | 5 | 5 | 5 | 11.2 | 4.8 | 198.5 | 3.8 | 7.9 | 0.45 | 70.5 | 4.8 | 2.9 | Good |
| 43 | 4 | 10 | 1 | 1 | 1 | 1 | — | 25 | 25 | 50 | 40 | 30 | 11.4 | 4.7 | 195.1 | 4.6 | 7.7 | 0.47 | 71.1 | 4.9 | 3.0 | Good |
| 44 | 4 | 10 | — | — | — | — | — | — | 20 | 5 | 40 | 5 | 10.2 | 4.5 | 237.8 | 4.3 | 80.1 | 0.45 | 801 | 5.3 | 3.7 | Good |
| 45 | 4 | 10 | — | — | — | — | — | — | 20 | 5 | 5 | 30 | 10.4 | 4.1 | 240.5 | 4.4 | 8.3 | 0.43 | 78.9 | 4.7 | 3.6 | Good |
| 46 | 4 | 10 | — | — | — | — | — | — | 20 | 50 | 5 | 5 | 10.3 | 4.4 | 243.1 | 5.0 | 7.7 | 0.47 | 77.1 | 4.9 | 3.8 | Good |
| 47 | 4 | 10 | — | — | — | — | — | — | 20 | 50 | 40 | 5 | 10.4 | 4.6 | 238.8 | 4.7 | 7.8 | 0.45 | 78.3 | 4.6 | 3.7 | Good |
| 48 | 4 | 10 | — | — | — | — | — | — | 20 | 50 | 5 | 30 | 10.2 | 4.7 | 237.1 | 4.4 | 7.4 | 0.48 | 79.5 | 4.2 | 3.5 | Good |
| 49 | 4 | 10 | — | — | — | — | — | — | 20 | 30 | 20 | 10 | 10.3 | 4.6 | 240.1 | 4.8 | 7.6 | 0.51 | 82.3 | 4.7 | 3.3 | Good |
| 50 | 4 | 10 | 2 | — | — | — | — | 30 | 20 | 30 | 20 | 10 | 11.4 | 4.5 | 214.2 | 4.7 | 8.3 | 0.49 | 77.1 | 4.4 | 3.0 | Good |
| 51 | 5 | 15 | — | 2 | 2 | — | — | — | 40 | 30 | 20 | 10 | 11.3 | 4.8 | 205.7 | 4.2 | 8.5 | 0.47 | 78.3 | 3.9 | 3.1 | Good |
| 52 | 5 | 15 | — | — | 3 | — | — | — | 20 | 35 | 25 | 15 | 10.7 | 4.6 | 210.7 | 5.1 | 8.2 | 0.50 | 77.9 | 4.6 | 3.3 | Good |
| 53 | 5 | 15 | — | — | 3 | — | — | 30 | 20 | 35 | 25 | 15 | 11.7 | 4.5 | 209.1 | 4.7 | 8.6 | 0.47 | 79.0 | 4.4 | 3.2 | Good |
| 54 | 5 | 6 | 2 | — | 1 | — | — | 25 | 30 | 30 | 25 | 15 | 11.5 | 4.7 | 205.8 | 4.3 | 8.4 | 0.45 | 75.7 | 4.7 | 3.1 | Good |
| 55 | 10 | 19 | 2 | — | 2 | 1 | — | 48 | 45 | 48 | 36 | 28 | 12.0 | 4.1 | 195.6 | 4.6 | 8.1 | 0.43 | 73.5 | 4.4 | 2.9 | Good |
| 56 | 2 | 3 | — | — | — | — | — | — | 2 | 5 | 5 | 5 | 8.1 | 4.0 | 240.9 | 5.4 | 6.9 | 0.52 | 78.3 | 4.7 | 4.0 | Good |

TABLE 2

Comparative Examples

| | Content (ppm by weight) | | | | | | | | | | | | Mechanical Strength | | Loop Height (μm) | | Pull Strength (gf) | | Shear Strength (gf) | | Wire Flow (%) | Ball |
|---|---|---|---|---|---|---|---|---|---|---|---|---|---|---|---|---|---|---|---|---|---|---|
| | | | | | | | | | | | | | B.1 | E.1 | | | | | | | | |
| No. | Sc | Be | Ca | Y | La | Ce | Dy | Ge | In | Ag | Cu | Pd | (gf) | (%) | Ave. | σ | Ave. | σ | Ave. | σ | Ave. | Shape |
| 1 | 1 | 2 | — | — | — | — | — | — | 1 | — | — | — | 6.8 | 4.8 | 245.2 | 10.5 | 5.9 | 0.83 | 78.5 | 5.9 | 9.1 | Good |
| 2 | 20 | 2 | — | — | — | — | — | — | 2 | — | — | — | 11.9 | 4.5 | 173.6 | 7.6 | 6.1 | 0.75 | 68.4 | 5.7 | 5.8 | Defective |
| 3 | 20 | 2 | — | — | — | — | — | — | 70 | — | — | — | 11.6 | 4.3 | 183.7 | 9.1 | 7.9 | 0.69 | 59.1 | 6.3 | 6.2 | Defective |
| 4 | 1 | 25 | — | — | — | — | — | — | 2 | — | — | — | 8.3 | 4.4 | 242.6 | 9.6 | 6.9 | 0.75 | 57.8 | 6.1 | 8.6 | Good |
| 5 | 1 | 25 | — | — | — | — | — | — | 60 | — | — | — | 8.7 | 4.1 | 249.9 | 7.9 | 7.1 | 0.77 | 60.3 | 6.7 | 10.3 | Defective |
| 6 | 20 | 25 | — | — | — | — | — | — | 2 | — | — | — | 11.9 | 4.7 | 167.1 | 6.9 | 5.8 | 0.64 | 49.4 | 6.1 | 5.1 | Defective |
| 7 | 20 | 25 | — | — | — | — | — | — | 60 | — | — | — | 12.1 | 4.2 | 184.5 | 8.3 | 6.7 | 0.78 | 45.7 | 6.8 | 6.2 | Good |
| 8 | 5 | 10 | 15 | — | — | — | — | — | 20 | — | — | — | 11.9 | 4.8 | 158.4 | 6.5 | 6.2 | 0.69 | 49.7 | 6.8 | 4.9 | Defective |
| 9 | 5 | 10 | — | 20 | — | — | — | — | 20 | — | — | — | 12.3 | 4.4 | 163.7 | 5.9 | 7.1 | 0.75 | 46.1 | 5.7 | 4.8 | Defective |
| 10 | 5 | 10 | — | — | — | — | — | 5 | 30 | — | — | — | 9.1 | 4.3 | 238.6 | 6.0 | 7.3 | 0.59 | 68.9 | 5.3 | 4.5 | Good |
| 11 | 5 | 10 | — | — | — | — | — | 60 | 30 | — | — | — | 10.3 | 4.2 | 235.4 | 6.6 | 5.9 | 0.63 | 64.7 | 5.1 | 6.3 | Good |
| 12 | 5 | 10 | — | — | — | — | — | — | 10 | 3 | 3 | 1 | 9.0 | 4.5 | 239.0 | 6.4 | 7.3 | 0.73 | 73.3 | 6.1 | 5.1 | Good |
| 13 | 5 | 10 | — | — | — | — | — | — | 10 | 3 | 3 | 50 | 8.9 | 4.7 | 235.9 | 4.9 | 7.3 | 0.58 | 71.9 | 5.9 | 4.0 | Good |
| 14 | 5 | 10 | — | — | — | — | — | — | 10 | 80 | 10 | 10 | 7.9 | 4.8 | 237.2 | 5.9 | 7.5 | 0.71 | 67.3 | 6.3 | 4.3 | Good |
| 15 | 5 | 10 | — | — | — | — | — | — | 10 | 10 | 70 | 10 | 8.4 | 4.5 | 236.7 | 5.5 | 7.0 | 0.68 | 70.1 | 6.1 | 4.0 | Good |
| 16 | 5 | 15 | 10 | 10 | — | — | — | — | 20 | — | — | — | 12.3 | 4.5 | 155.3 | 5.8 | 6.8 | 0.60 | 48.6 | 6.4 | 3.3 | Defective |
| 17 | 5 | 15 | 10 | 10 | — | — | — | — | 20 | — | — | — | 12.3 | 4.9 | 155.3 | 5.2 | 6.1 | 0.67 | 59.3 | 6.0 | 3.0 | Defective |
| 18 | 2 | 7 | 5 | 5 | 5 | 5 | — | 60 | 65 | 10 | 10 | 10 | 12.5 | 4.4 | 160.3 | 4.9 | 5.8 | 0.55 | 55.7 | 5.7 | 2.9 | Defective |
| 19 | 2 | 7 | 5 | 5 | 5 | 5 | — | 5 | 65 | 10 | 10 | 10 | 12.3 | 4.7 | 158.4 | 4.8 | 6.0 | 0.53 | 52.1 | 5.4 | 3.0 | Defective |
| 20 | 1 | 1 | — | — | — | — | — | 5 | 1 | 3 | 3 | 3 | 7.9 | 4.0 | 242.9 | 8.3 | 6.9 | 0.78 | 73.9 | 6.2 | 8.9 | Good |

INDUSTRIAL APPLICABILITY

The thin wire of gold alloy is industrially useful because it has a small fluctuation in loop height, a high bonding strength with small fluctuation, a small wire flow after resin molding, and a normal ball shape, which all enable wire bonding to be stably performed even when the wire diameter is as small as 20 to 30 μm.

I claim:

1. A thin wire of gold alloy for wire bonding, consisting of:

2 to 10 ppm by weight of scandium, 3 to 20 ppm by weight of beryllium, and 2 to 50 ppm by weight of indium; and the balance consisting of gold and unavoidable impurities.

2. A thin wire of gold alloy for wire bonding, consisting of:

2 to 10 ppm by weight of scandium, 3 to 20 ppm by weight of beryllium, and 2 to 50 ppm by weight of indium; at least one component selected from the group consisting of 1 to 5 ppm by weight of calcium, 1 to 5 ppm by weight of yttrium, 1–5 ppm by weight of at least one of rare earth metals, and 10 to 50 ppm by weight of germanium; and the balance consisting of gold and unavoidable impurities.

3. A thin wire of gold alloy for wire bonding, consisting of:

a first group of components consisting of 2 to 10 ppm by weight of scandium, 3 to 20 ppm by weight of beryllium, and 2 to 50 ppm by weight of indium and at least one component selected from the group consisting of 1 to 5 ppm by weight of calcium, 1 to 5 ppm by weight of yttrium, 1–5 ppm by weight of at least one of rare earth metals, and 10 to 50 ppm by weight of germanium; 5 to 50 ppm by weight of silver; 5 to 30 ppm by weight of palladium; 5 to 40 ppm by weight of copper; and the balance consisting of gold and unavoidable impurities.

* * * * *